United States Patent
Boldt

(10) Patent No.: US 7,219,029 B2
(45) Date of Patent: May 15, 2007

(54) METHOD FOR TESTING A MEMORY DEVICE AND MEMORY DEVICE FOR CARRYING OUT THE METHOD

(75) Inventor: Sven Boldt, Aschheim (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 11/204,739

(22) Filed: Aug. 15, 2005

(65) Prior Publication Data

US 2006/0036917 A1 Feb. 16, 2006

(30) Foreign Application Priority Data

Aug. 13, 2004 (DE) ...................... 10 2004 039 393

(51) Int. Cl.
G01R 31/00 (2006.01)
G01R 31/14 (2006.01)

(52) U.S. Cl. ..................................... 702/117

(58) Field of Classification Search ............... 702/117, 702/80
See application file for complete search history.

(56) References Cited

U.S. PATENT DOCUMENTS

| 6,539,505 | B1 * | 3/2003 | Dahn | 714/718 |
|---|---|---|---|---|
| 6,754,117 | B2 * | 6/2004 | Jeddeloh | 365/201 |
| 6,968,483 | B2 * | 11/2005 | Hartmann | 714/719 |
| 2003/0120974 | A1 * | 6/2003 | Adams et al. | 714/31 |
| 2005/0108609 | A1 * | 5/2005 | Thalmann | 714/742 |
| 2006/0064261 | A1 * | 3/2006 | Boldt | 702/80 |
| 2006/0232425 | A1 * | 10/2006 | Ueno | 340/572.8 |

FOREIGN PATENT DOCUMENTS

| EP | 1 434 370 | * | 6/2004 |
|---|---|---|---|
| WO | WO 04/017162 A2 | | 2/2004 |

* cited by examiner

*Primary Examiner*—Michael P Nghiem
(74) *Attorney, Agent, or Firm*—Maginot, Moore & Beck

(57) ABSTRACT

A memory device for data storage has a memory module with at least one memory bank in which data are stored and from which the stored data are read out, and a logic unit for controlling a writing and a reading of data to and from the at least one memory bank. Furthermore, a test module for testing the functionality of the memory module is provided. The test module is arranged in a manner separated from the memory module in a separate circuit unit, and is connected to the memory module via a communication device for the exchange of communication signals

15 Claims, 5 Drawing Sheets

METHOD FOR TESTING A MEMORY DEVICE AND MEMORY DEVICE FOR CARRYING OUT THE METHOD

Method for testing a memory device and memory device for carrying out the method

FIELD OF THE INVENTION

The present invention generally relates to memory devices having memory modules with high packing density. The present invention particularly relates to a method and a device for testing the memory modules contained in the memory device.

The present invention specifically relates to a memory device for data storage having a memory module, having at least one memory bank in which data to be stored are stored and from which the stored data are read out, and a logic unit for controlling a writing and a reading of data to and from the memory bank, and a test module for testing the functionality of the memory module.

In this case, the test module has a comparison compression device for outputting a defective determination signal if the memory module has at least one malfunction, whereas a defect-free determination signal is output when the memory module is operating correctly.

BACKGROUND

FIG. 4 shows a conventional memory device 100, which in this example has arranged four memory banks 101a, 101b, 101c and 101d. The individual memory banks 101a–101d are connected to a comparison and compression circuit V arranged in an evaluation circuit region A. The comparison and data compression circuit V serves for testing the functionality of the individual memory banks 101a–101d of the memory module 100. It should be pointed out that the circuit arrangement illustrated in FIG. 4 is a detail from an arbitrary semiconductor memory chip with memory array and data path. It is disadvantageous that in the conventional memory module 100 only ever one memory bank 101a, 101b, 101c, or 101d at a time can transmit results onto a data bus D.

As shown below with reference to FIG. 5, the data bus comprises four data lines 103a–103d in this example of a conventional memory module. In a conventional manner, the memory banks 101a–101d in each case comprise secondary sense amplifiers 102a–102d. All data lines are connected to the comparison and data compression circuit in order to be able to perform a data comparison and a data compression.

FIG. 5 shows the memory module 100 illustrated schematically in FIG. 4 in greater detail. FIG. 5 shows only two memory banks 101a, 101b with the corresponding secondary sense amplifiers 102a–102d. It should be pointed out that only four sense amplifiers 102a–102d are shown by way of example here, whereas in principle a large number of secondary sense amplifiers 102a–102n is provided in a memory bank 101a–101n, where the number n may be greater than 100.

The requirement for increasingly higher storage densities gives rise to the problem that a chip area, i.e. a space requirement for the memory module, has to be reduced. In the case of the conventional memory modules illustrated in FIGS. 4 and 5, it is thus inexpedient that the comparison and data compression circuit identified by a reference symbol V is arranged in the evaluation circuit region A (dashed region in FIG. 4). The comparison and data compression circuit V serves for testing the individual memory banks 101a–101n of the memory module, it being disadvantageous that only one memory bank 101a–101d in each case can be tested at a specific time. It is disadvantageous that a simultaneous testing of the memory banks 101a–101n contained in the memory module 100 is not made possible, in such a way that the test time is increased (four-fold in the example shown in FIG. 4 in order to test all four memory banks).

This inexpediently leads to the disadvantage that the test costs are increased as a result of a lengthening of the test time when testing the conventional memory module 100 for functionality. An increase in parallelism when testing the memory module 100 could be provided by increasing the number of internal data lines 103a–103d. However, increasing data lines in this way inexpediently leads to the disadvantage that they cause a considerable space requirement, as a result of which the chip area is disadvantageously enlarged.

SUMMARY

Therefore, it is an object of the present invention to provide a memory device for data storage in the case of which the memory module present in the memory device can be tested in a simple and efficient manner. In particular, it is necessary to reduce test costs.

This object is achieved by embodiments of the invention.

An important concept of the invention consists in providing a circuit unit by means of which the memory module is tested in a manner separated from the memory module. The customary arrangement of a test module within the memory device for testing the memory module present in the memory device has the disadvantage of a low degree of parallelism and a large space requirement. Another aspect of the invention consists in providing only connection units for connection of a test module in an evaluation circuit region of the memory module, said test module forming a separate circuit unit. The communication between the memory module to be tested and the test module that provides the test of the memory module is effected via a suitably designed communication device. The communication device advantageously comprises a needle card for making the electrical contact between the memory module and the test module.

Furthermore, it is expedient to design the communication device in such a way that communication signals can be exchanged via radio, i.e. in wire-free fashion. In a further aspect of the invention, the communication signals are exchanged optically between the test module and the memory module. In accordance with a general aspect, the memory device for data storage according to the invention essentially has:

a) a memory module having at least one memory bank in which data to be stored are stored and from which the stored data are read out, and a logic unit for controlling a writing and a reading of data to and from the at least one memory bank; and b) a test module for testing the functionality of the memory module, the test module having a comparison compression device for outputting a defective determination signal if the memory module has at least one malfunction, and for outputting a defect-free determination signal if the memory module is operating correctly. The test module is arranged in a manner separated from the memory module in a separate circuit unit, and is connected to the memory module via a communication device for the exchange of communication signals.

Furthermore, the method according to the invention for storing data to be stored essentially has the following steps of:

a) storing the data to be stored in a memory module, having at least one memory bank in which the data to be stored are stored and from which the stored data are read out, and a logic unit for controlling a writing and a reading of data to and from the memory bank; and b) testing the functionality of the memory module by means of a test module, a comparison compression device outputting a defective determination signal if the memory module has at least one malfunction, and a defect-free determination signal if the memory module is operating correctly, in a manner dependent on the serviceability of the memory module.

In accordance with this aspect of the method according to the invention, communication signals are exchanged between the test module and the memory module via a communication device, the test module being arranged in a manner separated from the memory module in a separate circuit unit.

In accordance with one preferred development of the present invention, the communication device via which the test module can be connected to the memory module is electrically connected by test module connection units to memory module connection units. Preferably, the communication device is designed as a needle card contact-making unit which electrically connects test module connection units to memory module connection units.

In accordance with a further preferred development of the present invention, the communication device via which the test module is connected to the memory module is provided as an RF or radio link. Such a radio link has the advantage that the communication signals can be transmitted in wire-free fashion, as a result of which it is possible to save or completely eliminate connecting lines between the memory module and the test module. Consequently, the test module is expediently totally separate from the memory module. Furthermore, it is expedient that a test module can test more than one memory module for functionality.

In accordance with yet another preferred development of the present invention, the communication device via which the test module is connected to the memory module is provided as an optical link. In particular when an optical access is provided between the test module and the memory module, it is advantageous to exchange optical communication signals between the two modules since these enable a greater data rate and data density in comparison with the abovementioned radio link.

In accordance with yet another preferred development of the present invention, a result communication signal is provided as a 1-bit wide defect-free/defective determination signal which indicates the functionality of the memory module.

In accordance with a further preferred development of the present invention, input communication signals are derived from secondary sense amplifiers arranged in the at least one memory bank of the memory module and are fed to the test system 200.

On account of the input communication signals, in the test system a result communication signal is preferably processed in the test system. Furthermore, it is possible for the result communication signal to be output from the test system, fed back into the memory module and processed there.

Such separate provision of the test module as a circuit unit arranged in a manner separated from the memory module enables the memory module to be tested with a high degree of parallelism. Furthermore, the space requirement of chip area on the memory module is reduced and the test costs are lowered.

Exemplary embodiments of the invention are illustrated in the drawings and are explained in more detail in the description below.

DETAILED DESCRIPTION

In the figures, identical reference symbols designate identical or functionally identical components or steps.

Figure 1:
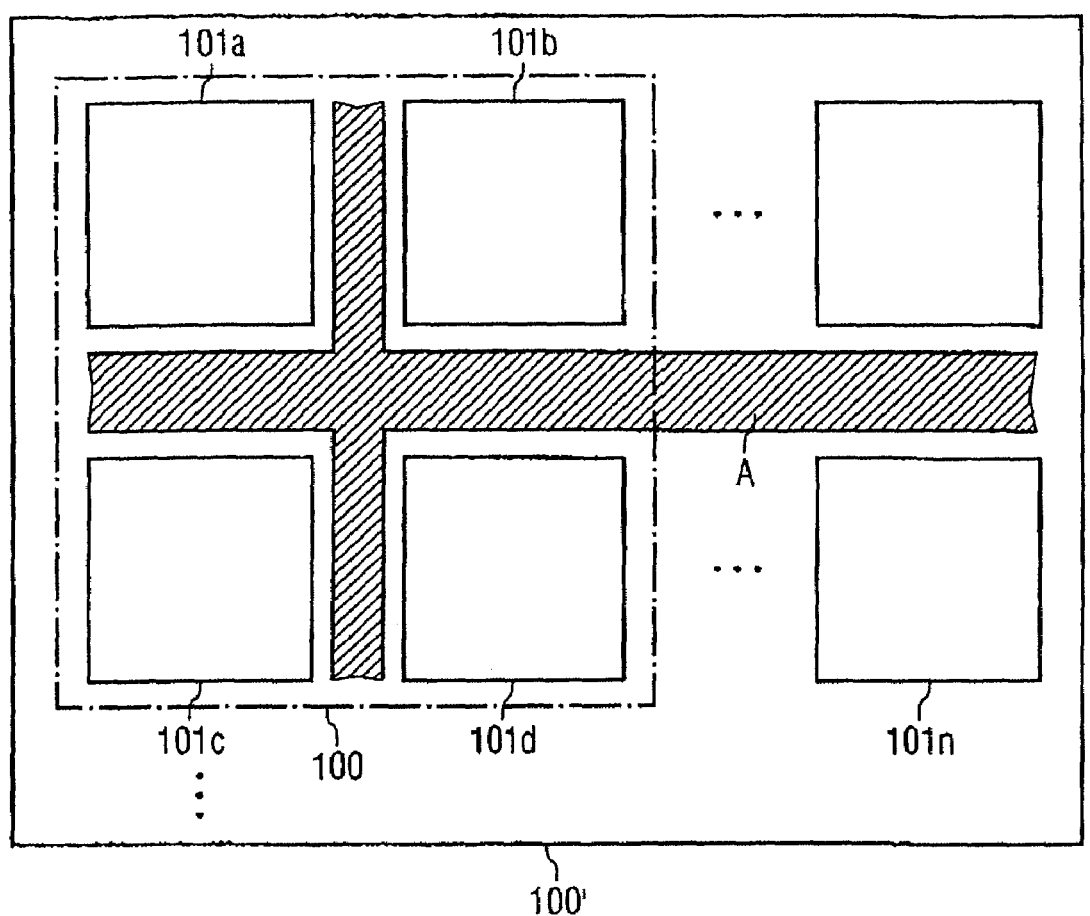
FIG. 1 shows a memory module with memory banks and an evaluation circuit region in accordance with a general aspect of the present invention.

FIG. 1 schematically shows a memory module 100', which may have a large number of memory banks 101a, 101b, . . . 101i, . . . 101n. A chip area of the memory module between the individual memory banks 101a–101n is identified by a hatched region A in FIG. 1. This hatched region is provided as an evaluation circuit region in which circuit units (for example logic units) for controlling writing and reading of data to and from the at least one memory bank may be arranged.

Figure 2:
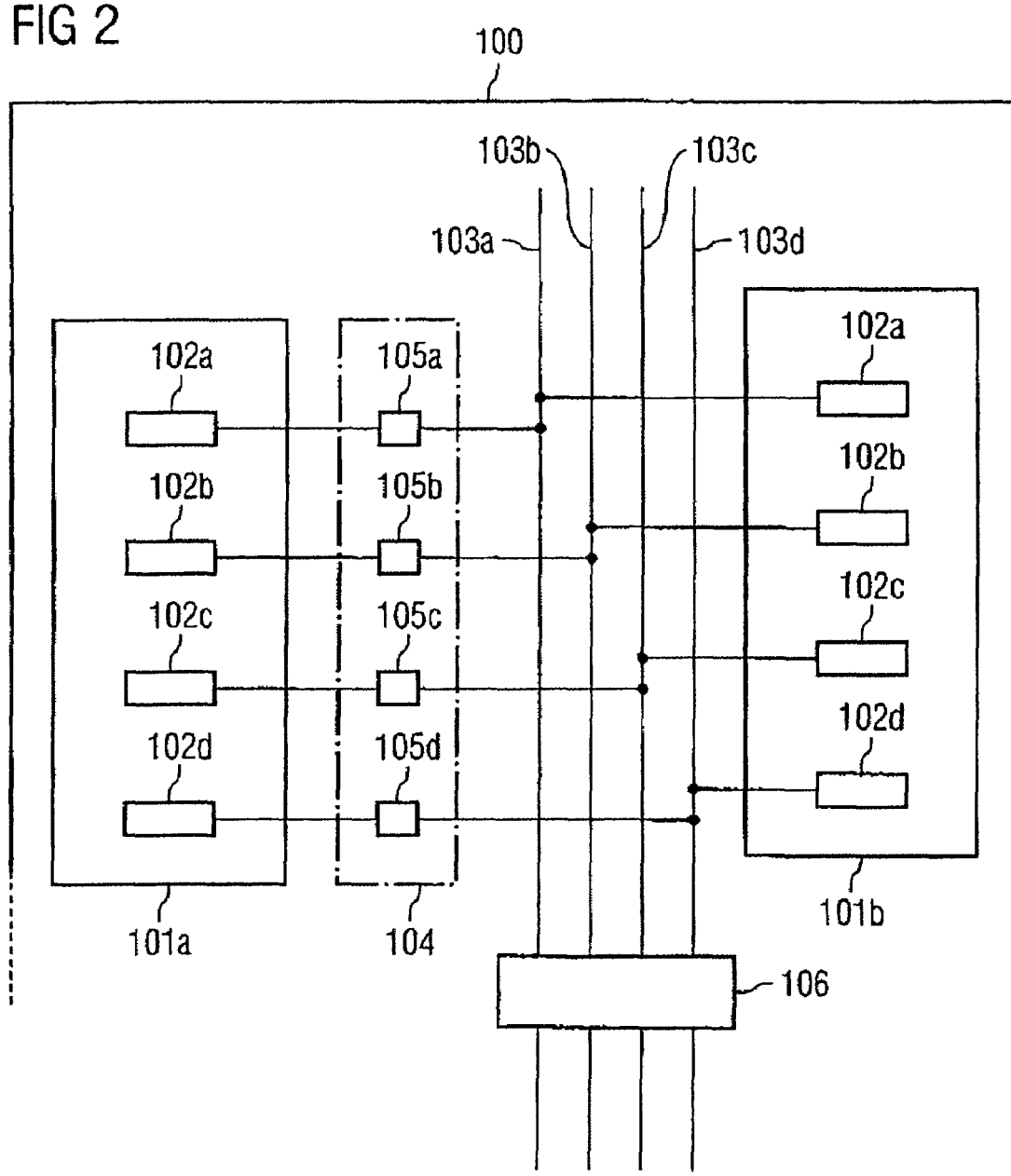
FIG. 2 shows the memory module shown in FIG. 1 in a more detailed illustration, only two memory banks being shown in order to provide clarity.

FIG. 2 illustrates an exemplary memory module 100 having four memory banks 101a, 101b, 101c and 101d, this region being encompassed by a broken line. It is assumed hereafter that the memory module comprises these four memory banks 101a–101d. It should be pointed out that the method according to the invention and the memory device with test module provided can also be applied to memory modules having a larger number of memory banks.

FIG. 2 shows a detail from the memory module 100 illustrated in FIG. 1, the two memory banks 101a–101b being illustrated in greater detail. The memory banks 101a, 101b in each case have secondary sense amplifiers 102a–102d via which data can be read out from the memory banks or written to the memory banks.

It should be pointed out that although only four secondary sense amplifiers 102a–102d are illustrated in FIG. 2, in principle a larger number of secondary sense amplifiers 102a–102n may be provided, specific memory banks comprising a number of $n \geq 100$ secondary sense amplifiers 102a–102n. In the present example, four secondary sense amplifiers 102a–102d are provided per memory bank 101a, 101b. A data bus for supplying the secondary sense amplifiers with corresponding data thus comprises four data lines 103a, 103b, 103c and 103d. The data lines of the data bus are connected on the one hand to the corresponding amplifier of the secondary sense amplifiers 102a–102d of the memory banks 101a, 101b and on the other hand to a logic unit 106. The logic unit serves only for controlling a writing or a reading of data to or from the at least one memory bank 101a–101d.

It should be pointed out that a comparison and data compression circuit as in the conventional memory module described above with reference to FIGS. 4 and 5 need not be provided here.

In this way, it is possible to save chip area. In order to test the memory module for its functionality, as illustrated in FIG. 2, memory module connection units 105a–105d are provided in a contact-making region 104. A communication with the (here by way of example 4) secondary sense amplifiers 102a–102d is possible via the memory module connection units 105a–105d. Furthermore, a connection to the four data lines 103a–103d may be provided. Although this is not shown in FIG. 2 it is furthermore possible to address the remaining (in this example two) memory banks 101c, 101d (not shown) via corresponding memory module connection units.

Figure 3:
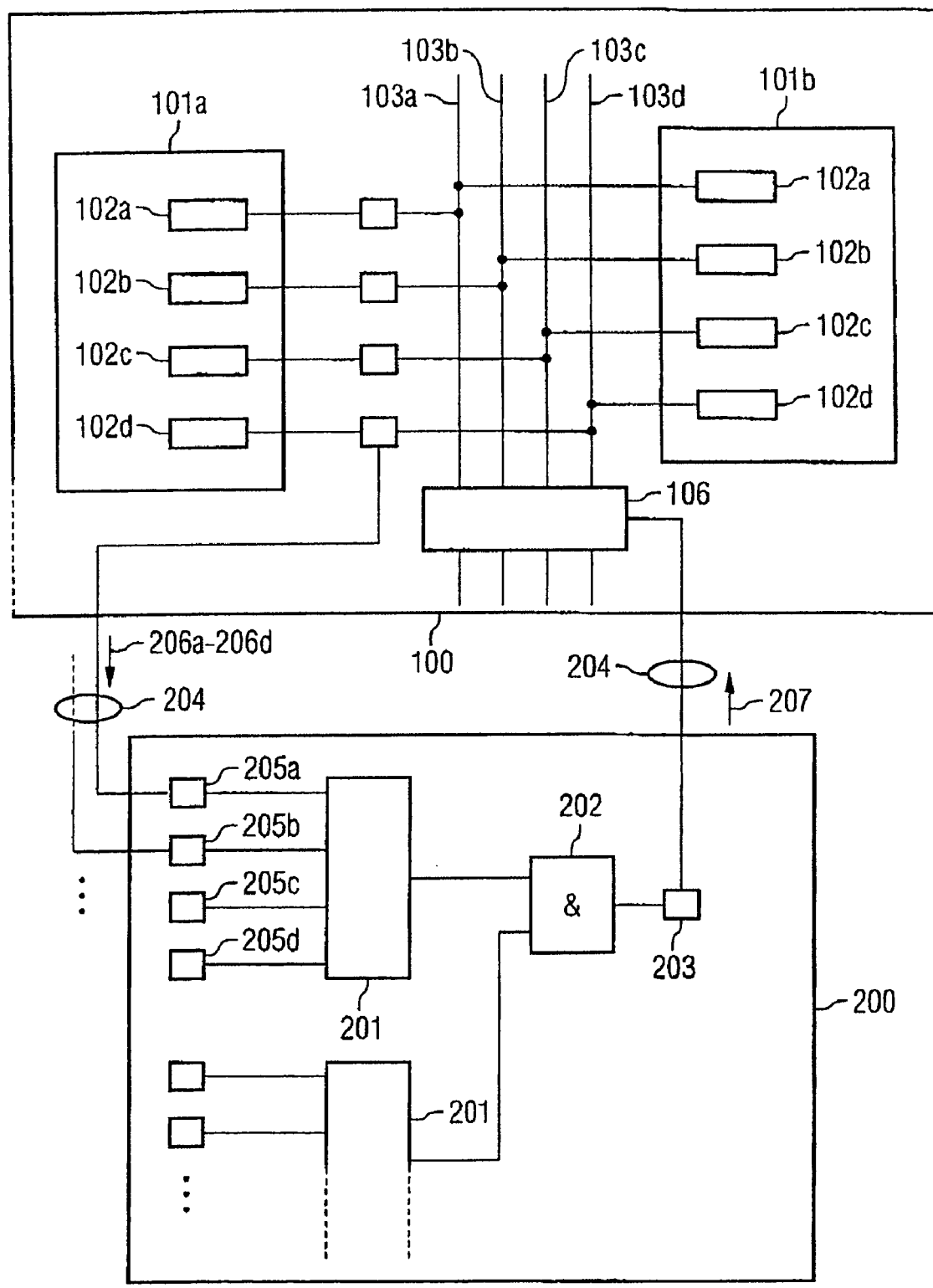
FIG. 3 shows the memory module shown in FIG. 2 and also a test module arranged separately from the memory module on a separated circuit unit, the memory module and the test module being connected to one another via a communication device.

FIG. 3 shows the memory device for data storage according to the invention, in the case of which the memory module 100 and a test module 200 are arranged on separate chips (circuit units). The memory module 100 corresponds to the memory module described with reference to FIG. 2. A description of this memory module 100 is omitted here in order to avoid an overlap in the description.

The test module 200 has test module input connection units 205a–205d. It should be pointed out that when a larger number of secondary sense amplifiers 102a–102d are provided in the memory module 100, it is also possible to provide a correspondingly increased number of test module connection units 205a–205n (illustrated by the dots in FIG. 3). It shall be assumed here that the test module 200 for testing the memory module 100 to be tested has four test module input connection units 205a–205d.

When the functionality of the memory module 100 is tested by means of the test module 200, in the test module desired data are compared with actual data read out from the at least one memory bank 101a–101n, whereupon a corresponding test result is provided, b1) a comparison compression device (201) outputting a defective determination signal if the memory module (100) has at least one malfunction, and a defect-free determination signal if the memory module (100) is operating correctly, in a manner dependent on the test result.

Furthermore, the test module 200 has a comparison compression device, in which a data comparison (actual data with desired data for testing the memory module to be tested) and also a data compression are effected. It should be pointed out that the circuit units for carrying out such a comparison and data compression operation, in the conventional memory device (FIG. 4 and FIG. 5), are disadvantageously situated on the memory module 100 and thereby cause a considerable space requirement.

In accordance with a principal aspect of the present invention, the circuit units shown in the test module 200 are now arranged separately from the memory module 100 in such a way that a chip area in the case of operation of the memory module 100 for data storage is reduced. It should be pointed out that the test module 200 may have a plurality of comparison compression devices 201 in order to be able to read out all input communication signals 206a–206n read out from the secondary sense amplifiers 102a–102n of the memory module 100.

The output signals of the comparison compression devices are combined in a combination unit 202. The output signals are preferably provided as defect-free determination signals if the corresponding tested memory bank 101a–101n is sound. If all tested memory banks 101a–101n of the memory module 100 are defect-free, then the ANDing provided in the combination unit 202 produces a result communication signal indicating a functionality of the tested memory module 100.

The test module 200 furthermore has a test module output connection unit 203, via which the result communication signal either can be tapped off and processed further in a further circuit unit, or can be fed back via a communication device 204 to the logic unit 106 of the memory module 100 in order to be processed further there.

The communication device 204 is provided for connecting the memory module connection units 105a–105d to the test module input connection units 205a–205d, on the one hand, and the test module output connection unit 203 of the test module 200 to the logic unit 106 of the memory module 100, on the other hand.

In this case, the communication device 204 may be provided as a wire-based communication device such as a needle card unit, for example, or as a wire-free communication device. A wire-free communication device comprises for example an RF or radio link or an optical link. Consequently, it is possible to address and to test a plurality of different memory modules 100 with one test module 200.

The memory device according to the invention saves test costs and increases parallelism when testing the memory module to be tested. A large number of test module input connection units 205a–205d may advantageously be provided for the test module 200. Furthermore, it is advantageous that comprehensive circuits can be provided for a data compression to be carried out in the test module 200, which circuits advantageously do not cause a space requirement on the memory module as a result of the invention's separation of test module 200 and memory module 100. The test signals which are fed to the memory module 100 via the test module 200 can be fed in directly upstream of the secondary sense amplifiers 102a–102n, in which case the signals to be read out can be tapped off directly downstream of the secondary sense amplifiers 102a–102n. As a result, it is possible in principle to simultaneously address all secondary sense amplifiers 102a–102n of a memory bank 101a–101n, thereby increasing parallelism when testing the memory module 100 to be tested.

After a testing and a data compression in the test module 200, the result of the data compression may be fed back to the memory module 100. Furthermore, it is possible for the test result to be evaluated directly in the test module 200 (not shown in FIG. 3). The same applies correspondingly to the write signals, as a result of which the memory module can be tested with great parallelism.

In order to carry out the method according to the invention for storing data to be stored in a memory module 100, the memory module 100 being able to be tested by the test module 200, it is necessary, in comparison with the conventional circuit arrangement, merely to provide corresponding memory module connection units 105a–105d in place of the comparison and data compression circuit.

The description above with reference to FIG. 3 stated that a result communication signal 207 is fed to the memory module 100 via a test module output connection unit 203 of the test module 200 in a manner dependent on a test result. Such a signal supplies a determination of whether the tested memory module 100 is defective or defect-free. Such a "pass-fail" signal can be returned to the memory module 100 in order to be processed further there, or can be processed further directly in the test module 200. During such testing, a data path of the memory module 100 is not tested or is only partially tested.

In order also to test the data path of the memory module 100, a bit combination that arises during testing can be driven back via the data path of the memory module 100. In this case, in the event of a positive comparison result, i.e. in the event of a defect-free determination signal ("pass" signal), the bit combination originally read out is written back to the memory module. By contrast, in the event of a negative comparison result, i.e. in the event of a defective determination signal ("fail" signal), a correspondingly inverted bit combination is written back to the memory module 100. The table below gives examples, represented in a hexadecimal code, of such bit combinations for the case of a defect-free determination signal (comparison results= "pass" signal) and a defective determination signal (comparison results="fail" signal).

| Output signal of the corresponding secondary sense amplifiers 102a–102d (Example) | Data path comparison result = "pass" | Data path comparison result = "fail" |
| --- | --- | --- |
| #F | #F | #0 |
| #0 | #0 | #F |
| #A | #A | #5 |
| #3 | #3 | #C |

The feedback of a result communication signal illustrated in accordance with the above table affords the advantage that the data path of the memory module 100 to be tested can also be concomitantly tested.

Figure 4:
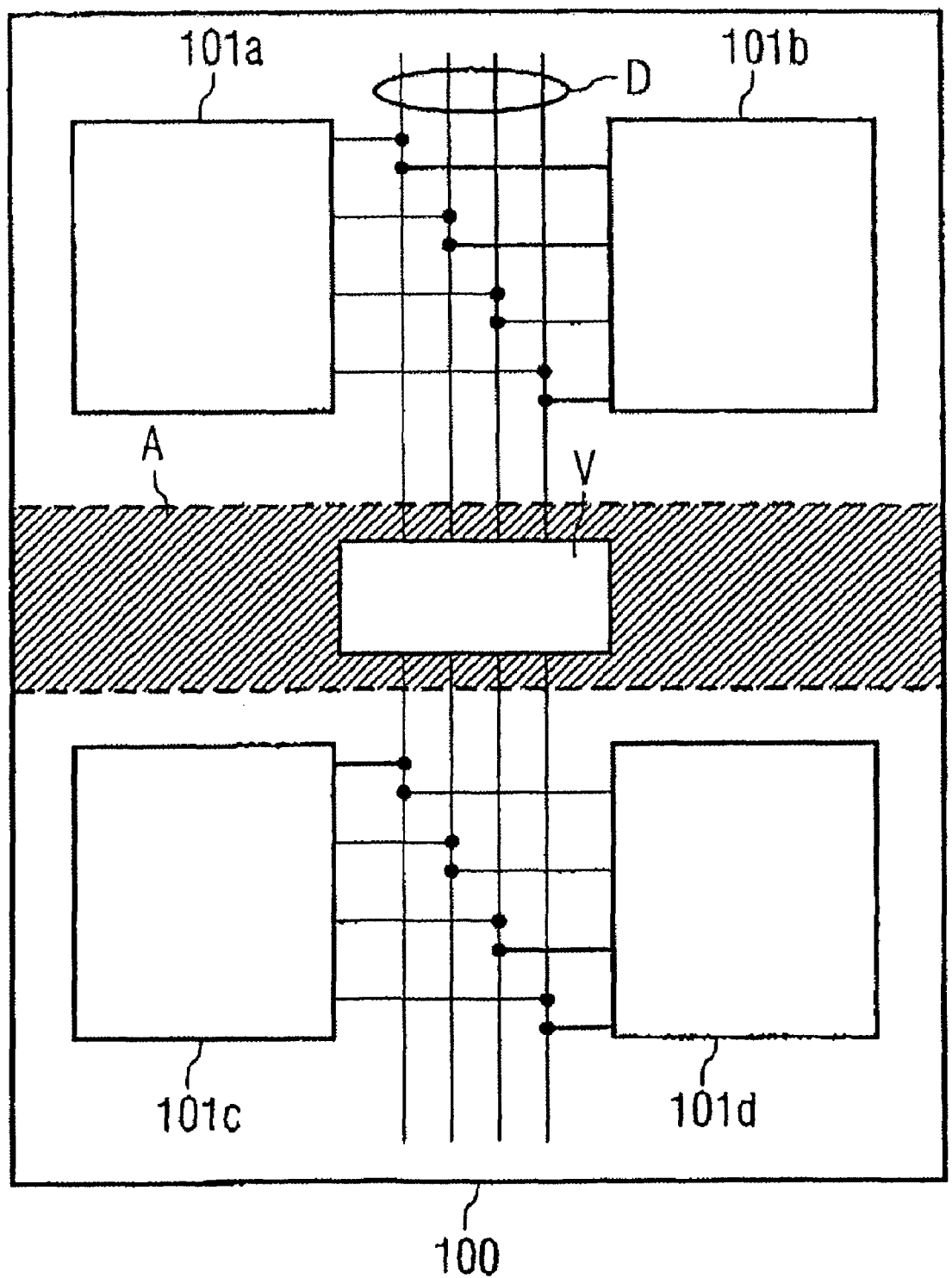
FIG. 4 shows a conventional memory device with a comparison and data compression circuit arranged thereon.
Figure 5:
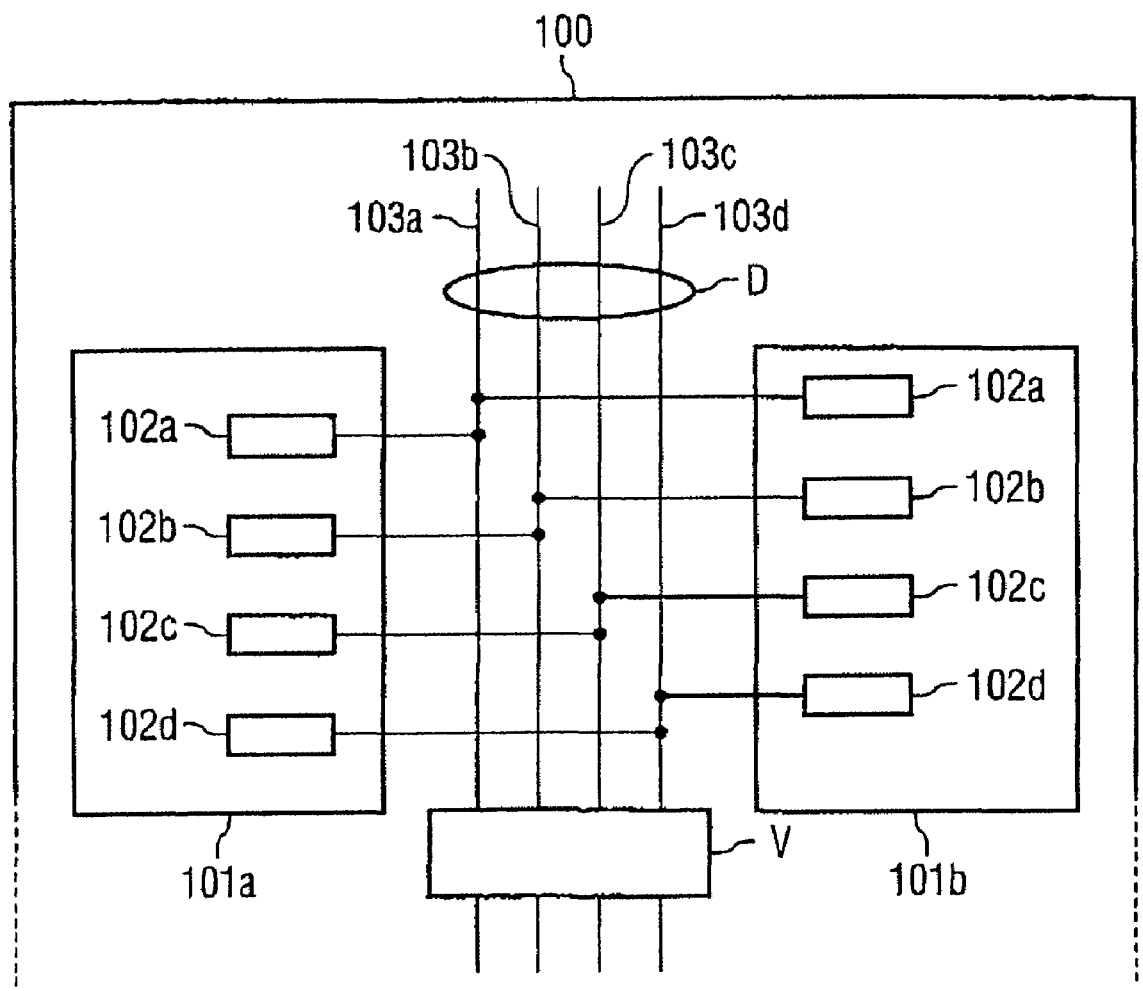
FIG. 5 shows the conventional memory device shown in FIG. 4 in greater detail.

With regard to the conventional memory device for data storage as illustrated in FIGS. 4 and 5, reference is made to the introduction to the description.

Although the present invention has been described above on the basis of preferred exemplary embodiments, it is not restricted thereto, but rather can be modified in diverse ways.

Moreover, the invention is not restricted to the application possibilities mentioned.

List of Reference Symbols

In the figures, identical reference symbols designate identical or functionally identical components or steps.

| 100, 100' | Memory module |
| --- | --- |
| 101a–101n | Memory bank |
| 102a–102d | Secondary sense amplifier |
| 103a–103d | Data lines |
| 104 | Contact-making region |
| 105a–105d | Memory module connection units |
| 106 | Logic unit |
| 200 | Test module |
| 201 | Comparison compression device |
| 202 | Combination unit |
| 203 | Test module output connection unit |
| 204 | Communication device |
| 205a–205d | Test module input connection units |
| 206a–206d | Input communication signals |
| 207 | Result communication signal |
| A | Evaluation circuit region |
| V | Comparison and data compression circuit |

The invention claimed is:

1. A memory device for data storage, having:
    a) a memory module having at least one memory bank configured to store data and a logic unit configured to control writing data to and reading data from the at least one memory bank; and
    b) a test module configured to test the functionality of the memory module, the test module configured to compare expected data with actual data read out from the at least one memory bank, and to provide a test result based on the comparison, the test module furthermore having a comparison compression device configured to provide as output, in a manner dependent on the test result, a result communication signal containing information identifying whether the memory module has at least one malfunction,
    wherein the test module is arranged in a manner separated from the memory module in a separate circuit unit, and is connected to the memory module via a communication device for the exchange of communication signals, and wherein the communication device comprises a radio link or an optical link, and
    wherein the communication signals include at least one of the actual data read out and the communication signal.

2. The device as claimed in claim 1, wherein the communication device comprises line wires which electrically connect connection units of the test module to connection units of the memory module.

3. The device as claimed in claim 1, wherein the communication device comprises a needle card contact-making unit which electrically connects connection units of the test module to connection units of the memory module.

4. The device as claimed in claim 1, wherein the result communication signal comprises a 1-bit wide defect-free/ defective determination signal which indicates the functionality of the memory module.

5. A method for storing data to be stored, having the following steps of:
    a) storing the data to be stored in a memory module having at least one memory bank and a logic unit configured to control writing data to and reading data from the memory bank;
    b) testing the functionality of the memory module using a test module, said testing including comparing expected data with actual data read out from the at least one memory bank, the test module being arranged in a manner separated from the memory module in a separate circuit unit;
    c) generating, responsive to the testing, a test communication signal containing information identifying whether the memory module has at least one malfunction; and
    d) exchanging communication signals between the test module and the memory module via a communication device, using a radio link an optical link, and
    wherein the communication signals include at least of the actual data read out and the test communication signal.

6. The method as claimed in claim 5, wherein step d) further comprises exchanging the communication signals using line wires which electrically connect connection units of the test module with connection units of the memory module.

7. The method as claimed in claim 5, wherein step c) further comprises generating the test communication signal as a 1-bit wide defect-free/defective determination signal which indicates the functionality of the memory module.

8. The method as claimed in claim 7, further comprising further processing the test communication signal in the test system.

9. The method as claimed in claim 7, further comprising providing the test communication signal to the memory module and processing the test communication signal in the memory module.

10. The method as claimed in claim 5, wherein step d) further comprises exchanging the communication signals between the test module and the memory module, at least some of the communication signals generated in part by secondary sense amplifiers arranged in the at least one memory bank and provided to the test module.

11. A memory device for data storage, having:
  a) a memory module having a first contiguous chip area containing a plurality of memory banks and a logic unit configured to control writing data to and reading data from the plurality of memory banks, each memory bank configured to store data and to provide stored data as output; and
  b) a test module disposed outside the first contiguous chip area, the test module configured to test the functionality of the memory module, the test module configured to compare expected data with actual data read out from the plurality of memory banks, and to, responsive to said comparison, generate a result communication signal containing information identifying whether the memory module has at least one malfunction;
  c) a communication device configured to operably connect the test module to the memory module to communicate at least one of the actual data read out and the result communication signal, wherein the communication device comprises a wireless device.

12. The device as claimed in claim 11, wherein the memory module further includes:
  a plurality of data lines disposed in the first contiguous area and operably connected to the logic unit and the plurality of memory banks, and
  connection units disposed in the first contiguous area and configured to connect to the communication device, the connection units coupled to the plurality of data lines.

13. The device as claimed in claim 12, wherein the communication device comprises line wires which electrically connect the connection units to the test module.

14. The device as claimed in claim 12, wherein the communication device comprises a needle card contact-making unit which electrically connects the connection units to the test module.

15. The device as claimed in claim 11, wherein the result communication signal comprises a 1-bit wide defect-free/defective determination signal which indicates the functionality of the memory module.

* * * * *